US009036052B2

(12) United States Patent
Awatani

(10) Patent No.: US 9,036,052 B2
(45) Date of Patent: May 19, 2015

(54) IMAGE PICKUP APPARATUS THAT USES PIXELS DIFFERENT IN SENSITIVITY, METHOD OF CONTROLLING THE SAME, AND STORAGE MEDIUM

(71) Applicant: CANON KABUSHIKI KAISHA, Tokyo (JP)

(72) Inventor: Yoshio Awatani, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 18 days.

(21) Appl. No.: 13/942,036

(22) Filed: Jul. 15, 2013

(65) Prior Publication Data

US 2014/0022401 A1 Jan. 23, 2014

(30) Foreign Application Priority Data

Jul. 18, 2012 (JP) ................................ 2012-159603

(51) Int. Cl.
*H04N 5/225* (2006.01)
*H04N 5/228* (2006.01)
*H04N 5/335* (2011.01)
*H04N 5/355* (2011.01)
*H01L 27/146* (2006.01)

(52) U.S. Cl.
CPC ........... *H04N 5/335* (2013.01); *H04N 5/35563* (2013.01); *H01L 27/14603* (2013.01); *H01L 27/14645* (2013.01)

(58) Field of Classification Search
CPC .................. H01L 27/14603; H01L 27/14645; H04N 5/335; H04N 5/35563
USPC .................. 348/294, 308, 207.1, 222.1, 229.1
See application file for complete search history.

(56) References Cited

U.S. PATENT DOCUMENTS

2004/0233324 A1* 11/2004 Galambos et al. ............. 348/372
2008/0259181 A1* 10/2008 Yamashita et al. ......... 348/229.1
2011/0032395 A1* 2/2011 Kido et al. .................... 348/272

FOREIGN PATENT DOCUMENTS

| JP | 2005-347932 A | 12/2005 |
| JP | 2010-028423 A | 2/2010 |
| JP | 2011-015219 A | 1/2011 |

* cited by examiner

*Primary Examiner* — Mekonnen Dagnew
(74) *Attorney, Agent, or Firm* — Cowan, Liebowitz & Latman, P.C.

(57) ABSTRACT

An image pickup apparatus capable of increasing the dynamic range and performing high-frame rate imaging. The image pickup apparatus includes a pixel section formed by arranging a plurality of pixels each including different types of pixels different in sensitivity to light, in a two-dimensional matrix form. Different types of ADCs perform analog-to-digital conversion of signals read out from the high-sensitivity pixels and low-sensitivity pixels in parallel and hold results in respective counter latch circuits. The pixel section has an interconnection layer including a plurality of interconnections for transferring the signals. One interconnection is used as a vertical read-out line for transferring signals from the low-sensitivity pixels, and another interconnection is used as a vertical read-out line for transferring signals from the high-sensitivity pixels.

8 Claims, 13 Drawing Sheets

FIG.5

| | CAMERA POWER OFF | NON-RECORDING OPERATION | RECORDING OPERATION (WIDE DYNAMIC RANGE IMAGE SHOOTING) | RECORDING OPERATION (NON-WIDE DYNAMIC RANGE IMAGE SHOOTING) |
|---|---|---|---|---|
| UPPER AD | POWER OFF | | POWER ON | POWER OFF |
| LOWER AD | POWER OFF | POWER OFF | POWER ON | POWER ON |

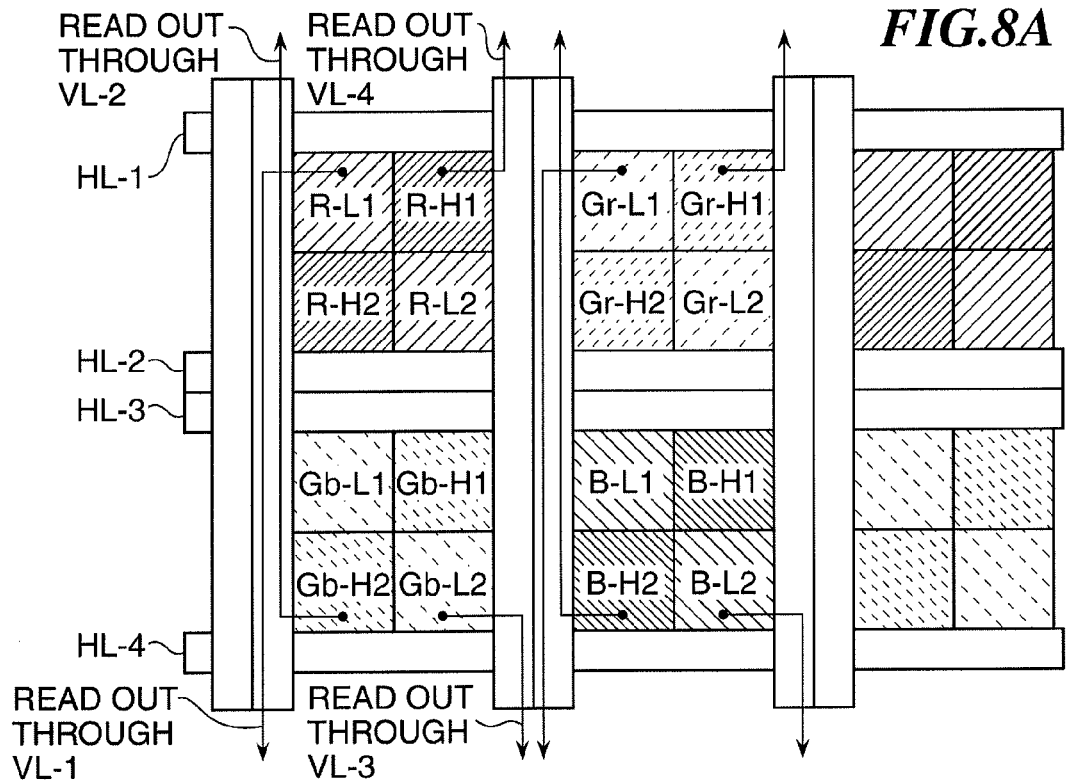
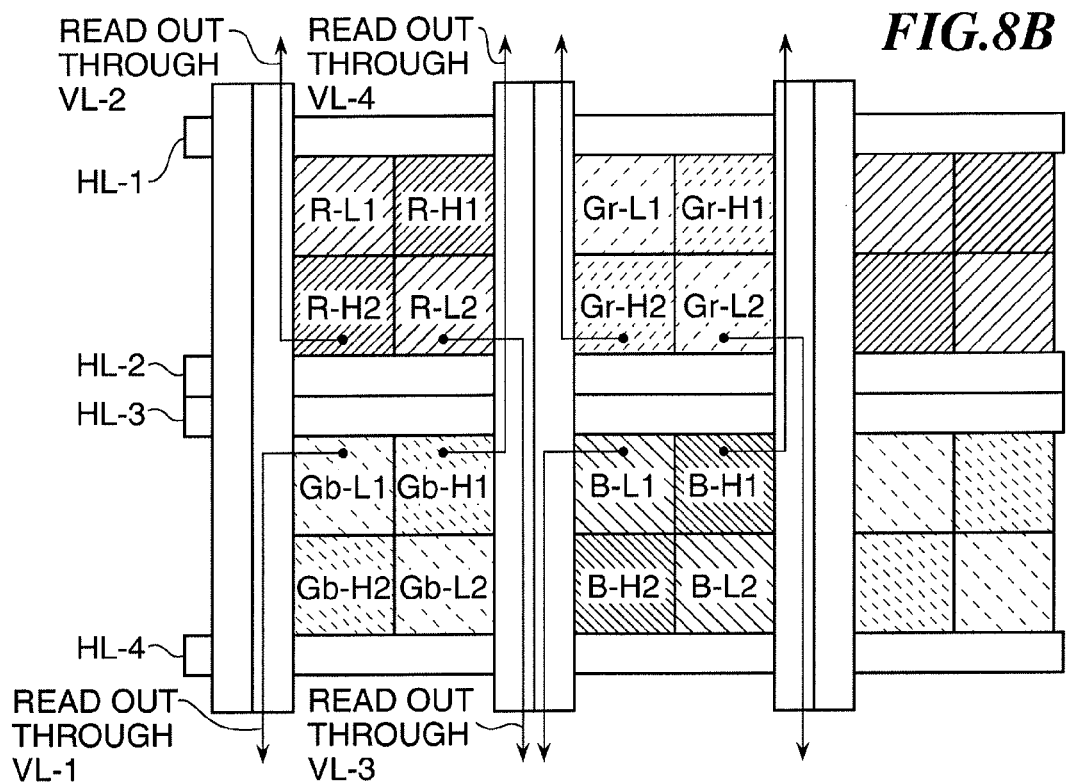

IMAGE PICKUP APPARATUS THAT USES PIXELS DIFFERENT IN SENSITIVITY, METHOD OF CONTROLLING THE SAME, AND STORAGE MEDIUM

BACKGROUND OF THE INVENTION

1. Field of the Invention

The present invention relates to an image pickup apparatus, a method of controlling the same, and a storage medium, and more particularly to an image pickup apparatus including analog-to-digital converters.

2. Description of the Related Art

In general, in a case where there is a high-luminance object, such as headlights or sunlight, within a shooting area, an image obtained as a result of shooting is required to have no so-called whiteout caused thereon, and what is more, have no blackout caused in a low-luminance area thereof. That is, to shoot an image under such a condition, a wide dynamic range image is required.

To obtain a wide dynamic range image, first, a low-sensitivity image suitable for a high-luminance object and a high-sensitivity image suitable for a low-luminance object are obtained. Then, image processing is performed on these images of the two types to thereby generate a wide dynamic range image. To this end, there is a demand for a solid-state image pickup apparatus, such as a CMOS image sensor, which is capable of simultaneously obtaining a low-sensitivity image and a high-sensitivity image.

In addition, although conventionally a progressive moving image having a frame rate of 30 Hz and an interlace moving image having a frame rate of 60 Hz have been generally used as moving images, with an increase in the operating speed of display devices, there is a demand for a solid-state image pickup apparatus which is capable of shooting a progressive moving image at a frame rate of 60 Hz or shooting an image at a higher frame rate than 60 Hz. If it is possible to perform imaging at a high frame rate, it becomes possible to accurately capture a motion of an object moving at a high speed. Further, by using such a solid-state image pickup apparatus capable of performing high-frame rate imaging, it is possible to synthesize a plurality of images and perform image processing to improve the S/N ratio and expand the dynamic range.

There has been proposed a solid-state image pickup apparatus including two or more analog-to-digital converters (ADCs) provided for each column of pixels and configured to perform high-frame rate imaging by distributing outputs from pixels in each column to these analog-to-digital converters to thereby achieve high-speed imaging by parallel processing (see Japanese Patent Laid-Open Publication No. 2005-347932).

Further, there has been proposed a solid-state image pickup apparatus having unit pixels each provided with a first photodiode and a second photodiode lower in optical sensitivity than the first photodiode, for photoelectrically converting and accumulating incident light, so as to increase the dynamic range. This image pickup apparatus has a high-sensitivity mode for outputting a signal generated by amplifying a potential obtained by reading out and adding signal charges from the first and second photodiodes, and a low-sensitivity mode for outputting a signal generated by amplifying a potential obtained by reading out the signal charge from the second photodiode (see Japanese Patent Laid-Open Publication No. 2011-15219). By switching these modes, the sensitivity is increased when the amount of incident light is small, and is reduced when the amount of incident light is large, to thereby prevent outputs from the unit pixels from being saturated and increase the dynamic range.

Further, there has been proposed a solid-state image pickup apparatus including a pixel section formed by arranging a plurality of pixels in a matrix form in which each pixel includes a plurality of divisional pixels formed by dividing the one pixel into areas which are different in the amount of charge to be accumulated, and when reading out a pixel signal, divisional pixel signals from respective divisional pixels are read out and added after being subjected to analog-to-digital conversion to thereby obtain pixel signals of respective pixels (see Japanese Patent Laid-Open Publication No. 2010-28423).

As described above, Japanese Patent Laid-Open Publication No. 2005-347932 discloses a method for performing high-frame rate imaging, and Japanese Patent Laid-Open Publication No. 2011-15219 and Japanese Patent Laid-Open Publication No. 2010-28423 each disclose a method for increasing the dynamic range. However, a method for increasing the dynamic range and performing high-frame rate imaging is not disclosed.

Particularly, when one pixel includes a plurality of photodiodes, as disclosed in Japanese Patent Laid-Open Publication No. 2011-15219 or Japanese Patent Laid-Open Publication No. 2010-28423, it is difficult to read out pixel signals at a high frame rate.

SUMMARY OF THE INVENTION

The present invention provides an image pickup apparatus capable of increasing the dynamic range and performing high-frame rate imaging, a method of controlling the same, and a storage medium.

In a first aspect of the present invention, there is provided an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, the image pickup apparatus comprising a first signal processing unit and a second signal processing unit each configured to perform analog-to-digital conversion processing on a pixel signal read from each pixel of the pixel section to thereby obtain image data, an interconnection layer including a plurality of interconnections for transferring the pixel signal to the first signal processing unit and the second signal processing unit, and a read-out unit configured to, when the pixel signal is read out from the first pixel, transfer the pixel signal to the first signal processing unit through one interconnection of the interconnection layer, and when the pixel signal is read out from the second pixel, transfer the pixel signal to the second signal processing unit through another interconnection of the interconnection layer.

In a second aspect of the present invention, there is provided a method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to the first signal processing unit and the second signal processing unit, the method comprising transferring, when the pixel signal is read out from the first pixel, the pixel signal to the first signal processing unit through one interconnection of the interconnection layer, and transferring, when the pixel signal is read out from the second pixel, the pixel signal to the second signal processing unit through another interconnection of the interconnection layer.

In a third aspect of the present invention, there is provided a non-transitory computer-readable storage medium storing a computer-executable control program for causing a computer to execute a method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to the first signal processing unit and the second signal processing unit, wherein the method comprises transferring, when the pixel signal is read out from the first pixel, the pixel signal to the first signal processing unit through one interconnection of the interconnection layer, and transferring, when the pixel signal is read out from the second pixel, the pixel signal to the second signal processing unit through another interconnection of the interconnection layer.

According to the present invention, it is possible to increase the dynamic range and perform high-frame rate imaging.

Further features of the present invention will become apparent from the following description of exemplary embodiments with reference to the attached drawings.

BRIEF DESCRIPTION OF THE DRAWINGS

FIG. 5 is a diagram useful in explaining control performed according to an operation mode of a camera on which the image pickup apparatus shown in FIG. 1 is mounted.

FIGS. 6A and 6B are diagrams useful in explaining an example of a pixel structure of the pixel section appearing in FIG. 1, in which FIG. 6A is a plan view, and FIG. 6B is a cross-sectional view, partly omitted, taken along X-X in FIG. 6A.

FIGS. 8A and 8B are diagrams useful in explaining flows of signals in the read-out control described with reference to FIG. 7, in which FIG. 8A shows flows of signals during a first period, and FIG. 8B shows flows of signals during a second period.

FIGS. 10A and 10B are diagrams useful in explaining flows of signals in the read-out control described with reference to FIG. 9, in which FIG. 10A shows flows of signals during a first period, and FIG. 10B shows flows of signals during a second period.

FIGS. 13A and 13B are diagrams useful in explaining flows of signals in the read-out control described with reference to FIG. 12, in which FIG. 13A shows flows of signals during a first period, and FIG. 13B shows flows of signals during a second period.

DESCRIPTION OF THE EMBODIMENTS

The present invention will now be described in detail below with reference to the accompanying drawings showing embodiments thereof.

Figure 1:
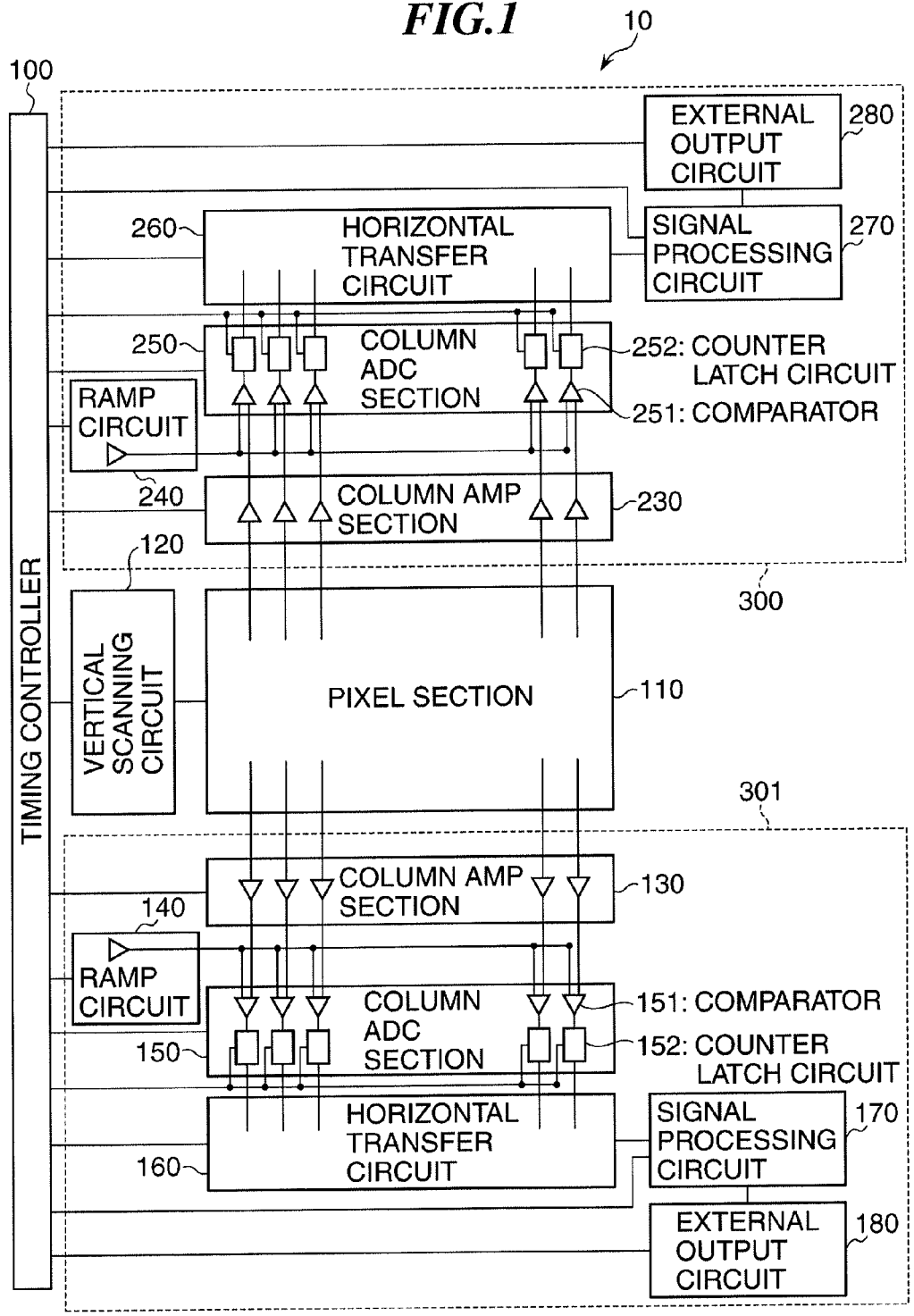
FIG. 1 is a block diagram of an image pickup apparatus according to an embodiment of the present invention.

FIG. 1 is a block diagram of an example of an image pickup apparatus according to an embodiment of the present invention. The illustrated image pickup apparatus (hereinafter also referred to as the solid-state image pickup apparatus) has a plurality of pixels arranged in a two-dimensional matrix form, and is a so-called parallel ADC CMOS image sensor including an analog-to-digital converter (ADC) provided for each column of pixels. A timing controller 100 is connected to the solid-state image pickup apparatus, denoted by reference numeral 10.

The solid-state image pickup apparatus 10 includes a pixel section 110 having a plurality of pixels arranged in a two-dimensional matrix form. The solid-state image pickup apparatus 10 further includes a vertical scanning circuit 120, column amplifier (AMP) sections 130 and 230, ramp circuits 140 and 240, column ADC sections 150 and 250, horizontal transfer circuits 160 and 260, signal processing circuits 170 and 270, and external output circuits 180 and 280. Further, as shown in FIG. 1, each ADC of the column ADC section 150 are provided for each associated column of pixels of the pixel section 110, and each ADC of the ADC section 150 includes a comparator 151 and a counter latch circuit 152. Similarly, each ADC of the column ADC section 250 includes a comparator 251 and a counter latch circuit 252.

Note that each unit amplification element of the column amplifier sections 130 and 230 is provided for each associated column of pixels. In other words, the unit amplification elements of the column amplifier sections 130 and 230 are connected to respective associated vertical read-out lines, described hereinafter.

The illustrated solid-state image pickup apparatus 10 has a vertically symmetrical arrangement as viewed in FIG. 1 with the pixel section 110 in the center, and hence hereafter, the description of the solid-state image pickup apparatus 10 will be focused on components located below the pixel section 110, as viewed in FIG. 1. That is, a block 300 and a block 301 surrounded by broken lines in FIG. 1 have the same construction, and hence the description of the solid-state image pickup apparatus 10 will be focused on the block 301.

The pixel section 110 is a photoelectric conversion device that outputs amounts of charge each corresponding to a light amount of an optical image, as voltage signals. The timing controller 100 controls an operation clock signal (CLK) and a timing signal which are supplied to the solid-state image pickup apparatus 10.

The vertical scanning circuit 120 performs timing control for sequentially reading out voltage signals (hereinafter also referred to as the pixel signals) from the pixel section 110 for each frame of an image under the control of the timing controller 100. In general, the pixel signals are sequentially read out on a row-by-row basis from an uppermost row to a lowermost row for each frame of an image, as viewed in FIG. 1.

Each unit amplification element of the column amplifier section 130 amplifies a voltage signal (pixel signal) read from an associated pixel of the pixel section 110 on a column-by-column basis. The unit amplification element of the column amplifier section 130 amplifies the voltage signal to thereby increase a signal level. This uniformly increases the S/N ratio of the signals against noise from the ramp circuit 140 and the column ADC section 150 which are disposed at respective latter processing stages downstream of the column amplifier section 130.

However, the column amplifier section 130 is not necessarily required in a circuit structure in which noise from the ramp circuit 140 and the column ADC section 150 is sufficiently small in comparison with noise caused in the pixel section 110.

The ramp circuit 140 generates a ramp signal having a constant slope in a time direction. In the column ADC section 150, the comparator 151 compares an output signal (amplified signal) from the column amplifier section 130 and a ramp signal from the ramp circuit 140. Then, the comparator 151 outputs a comparison result signal according to a result of the comparison.

The counter latch circuit 152 performs a counting operation over a time period corresponding to duration of the comparison result signal. By this counting operation, a count value proportional to a level (and duration) of an amplified signal is obtained. The count value is a result of analog-to-digital conversion (analog-to-digital conversion processing result), and the counter latch circuit 152 latches (hold) the count value as an image data item of each associated column.

A row of image data items held in the counter latch circuit 152 are sequentially read out by the horizontal transfer circuit 160. An output (read-out signal) from the horizontal transfer circuit 160 is input to the signal processing circuit 170.

The signal processing circuit 170 is a circuit which digitally performs signal processing, and adds a predetermined amount of an offset value to a read-out signal, and performs a gain-based calculation by performing a shift operation and multiplication. Then, a processed signal (parallel signal of multiple bits) which is an output from the signal processing circuit 170 is delivered to the external output circuit 180.

The external output circuit 180 has a serialize function, and converts the parallel signal output from the signal processing circuit 170 to a serial signal. Then, the external output circuit 180 converts the serial signal to e.g. an LVDS (low voltage differential signaling) signal, and outputs the LVDS signal to an external device by high-speed serial communication.

Figure 2:
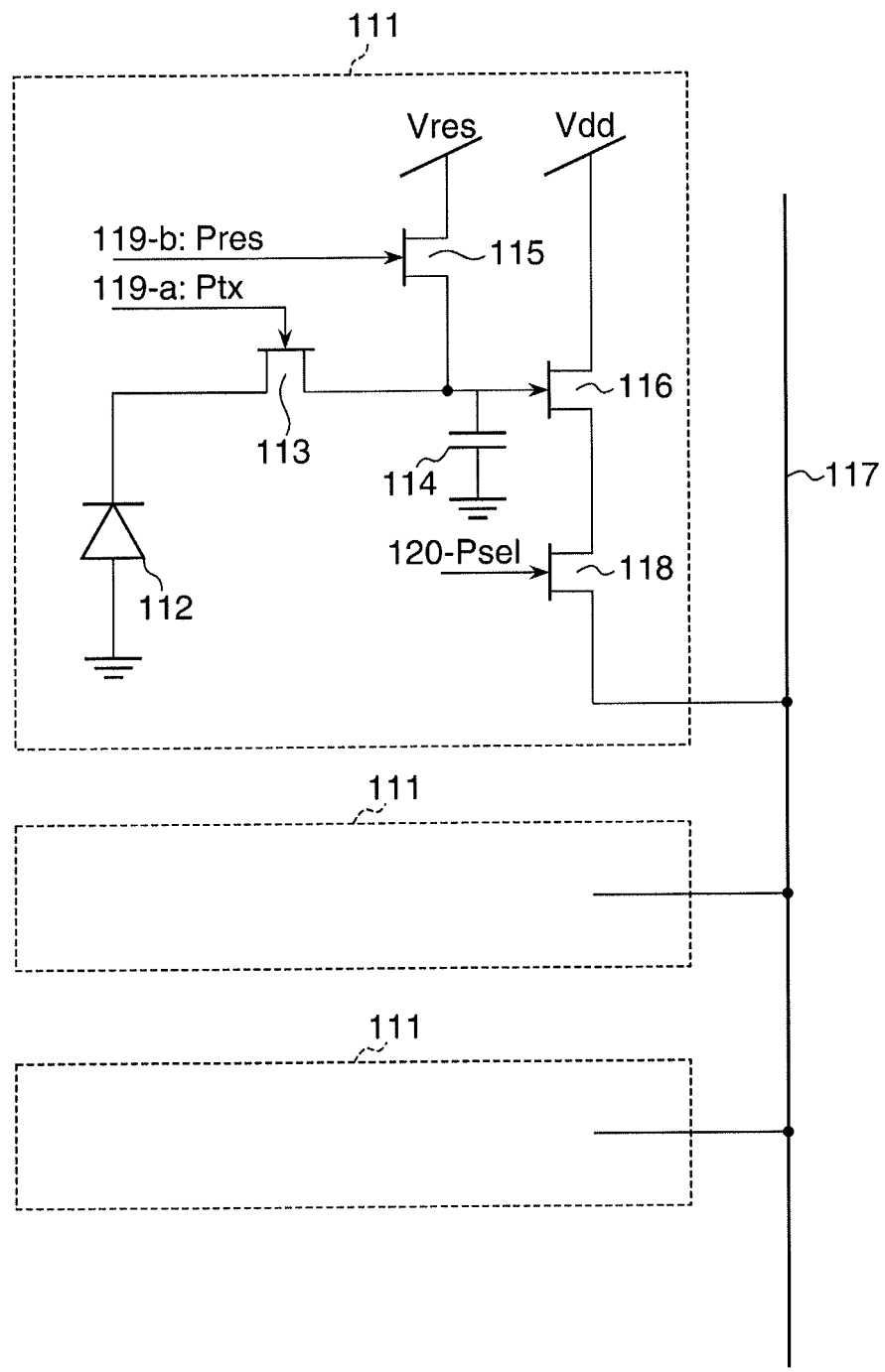
FIG. 2 is a diagram useful in explaining the arrangement of a pixel section appearing in FIG. 1.

FIG. 2 is a diagram useful in explaining the arrangement of the pixel section 110 appearing in FIG. 1.

As mentioned hereinabove, the pixel section 110 has a plurality of pixels (also referred to as unit pixels), denoted by reference numeral 111, arranged in a two-dimensional matrix form (the example illustrated in FIG. 2 shows the pixels 111 of one column). Each pixel 111 includes a photodiode (PD) 112 which is a photoelectric conversion element, and the PD 112 accumulates charge corresponding to an amount of incident light. A transfer transistor (Ptx-Tr) 113 transfers charge accumulated in the PD 112 to a floating diffusion (FD) 114. The Ptx-Tr 113 is switched on when a transfer pulse Ptx delivered through a transfer control line 119-*a* reaches a high level (H level), and permits charge to be transferred from the PD 112 to the FD 114. Then, the charge is converted to a voltage signal by the FD 114.

A reset transistor (RST-Tr) 115 resets the FD 114 according to a reset pulse Pres delivered through a reset control line 119-*b*. Before the charge is permitted to be transferred from the PD 112 to the FD 114 by the Ptx-Tr 113, the level of the FD 114 is reset by the RES-Tr 115 to a reset level (Vres).

The level of the FD 114 obtained after the reset is cancelled and before the Ptx-Tr 113 is switched on is set as an N level, and the level of the FD 114 obtained after the Ptx-Tr 113 is switched and charge is transferred from the PD 112 is set as an S level. A differential value between the N level and the S level is determined by signal processing, described hereinafter, and the differential value is handled as an image signal which is proportional to a light amount.

A source follower transistor (SF-Tr) 116 is a driver circuit that passes an output voltage from the FD 114 to a circuit at a latter processing stage. The vertical read-out line, denoted by reference numeral 117, is connected to an input terminal of the column amplifier section 130, and is shared by the plurality of pixels 111 arranged in a column direction.

By performing on-off control of a selection transistor (SEL-Tr) 118, the source follower transistors 116 of pixels other than a pixel to be read out are disconnected from the vertical read-out line 117. As a consequence, a pixel signal is selectively read out from the plurality of pixels arranged in the column direction. The SEL-Tr 118 is on-off controlled according to a selection signal (120-Psel signal).

Note that the above-mentioned transfer signal, reset signal, and selection signal are provided from the vertical scanning circuit 120 to the pixel section 110 under the control of the timing controller 100.

Figure 3:
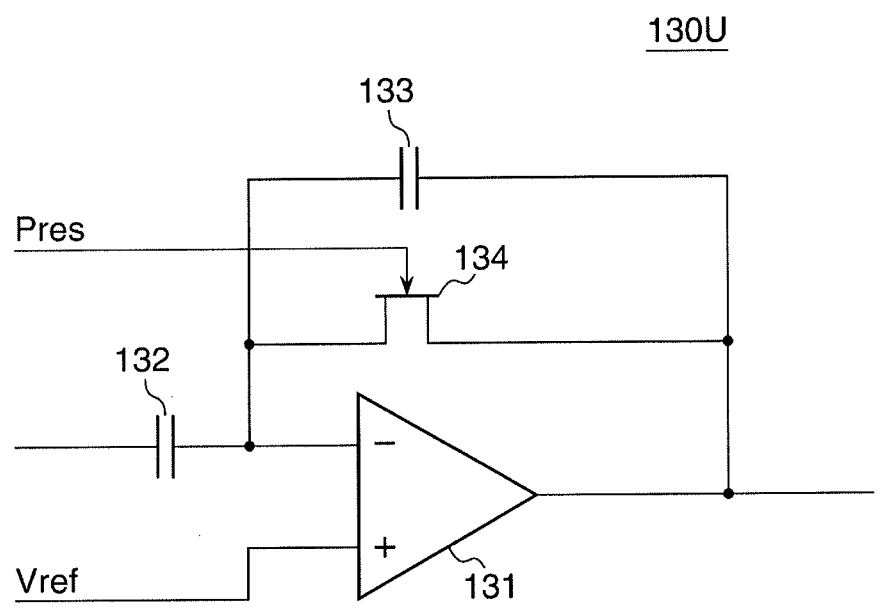
FIG. 3 is a circuit diagram showing an example of the construction of a unit amplification element of a column amplifier section appearing in FIG. 1.

FIG. 3 is a circuit diagram showing an example of the construction of a unit amplification element of the column amplifier section 130 appearing in FIG. 1.

Focusing on the unit amplification element, denoted by 130U, of the column amplifier section 130, the unit amplification element 130U of the column amplifier section 130 includes an amplifier 131, a first capacitor (Cin) 132, a second capacitor (Cfb) 133, and a reset switch (RST-SW) 134. A reference voltage (Vref) is applied to a plus (+) terminal of the amplifier 131, and the first capacitor 132 is connected to a minus (−) terminal of the amplifier 131.

First, the RST-SW 134 is switched on during a time period in which the FD 114 is reset by the RST-Tr 115. As a result, charge accumulated in the second capacitor 133, which is a feedback capacitor, is reset. Then, when the RST-SW 134 is switched off, the unit amplification element 130U of the column amplifier section 130 functions as an amplifier, and a voltage applied to the first capacitor 132, which is an input capacitor, appears at an output terminal of the amplifier 131 at a voltage level dependent on a ratio of the capacity of the first capacitor 132 to that of the second capacitor 133.

In actuality, the RST-SW 134 is switched off in a state where the reset pulse Pres goes low (is changed to an L level), causing cancellation of the reset state of the FD 114. As a result, reset noise generated by resetting the FD 114 is stored in the first capacitor 132. The reset noise is superimposed on both of results of N-conversion and S-conversion in analog-to-digital conversion, described hereinafter, and hence can be removed in a CDS operation (calculation of S conversion−N conversion), described hereinafter.

In the N conversion, a voltage signal at the N level (reset level before the Ptx-Tr 113 is caused to conduct) of a selected pixel is input to the first capacitor 132 through the vertical read-out line 117. Therefore, a voltage signal obtained by amplifying the voltage signal at the N level is output from an output terminal of the column amplifier section 130. The voltage signal obtained by amplifying the voltage signal at the N level is converted from analog to digital by an associated ADC of the column ADC section 150 (a result of this analog-to-digital conversion is referred to as N-AD).

Next, in the S conversion, when the transfer pulse Ptx goes high (is changed to a H level) to cause the Ptx-Tr 113 to conduct, whereby a voltage signal at the S level (signal level after conduction of the Ptx-Tr 113) corresponding to an amount of charge accumulated in the PD 112 is input to the first capacitor 132 through the vertical read-out line 117. As a result, a voltage signal obtained by amplifying the voltage signal at the S level is output from an output terminal of an associated unit amplification element of the column amplifier section 130. The voltage signal obtained by amplifying the voltage signal at the S level is converted from analog to digital by an associated ADC of the column ADC section 150 (a result of this analog-to-digital conversion is referred to as S-AD).

Figure 4:
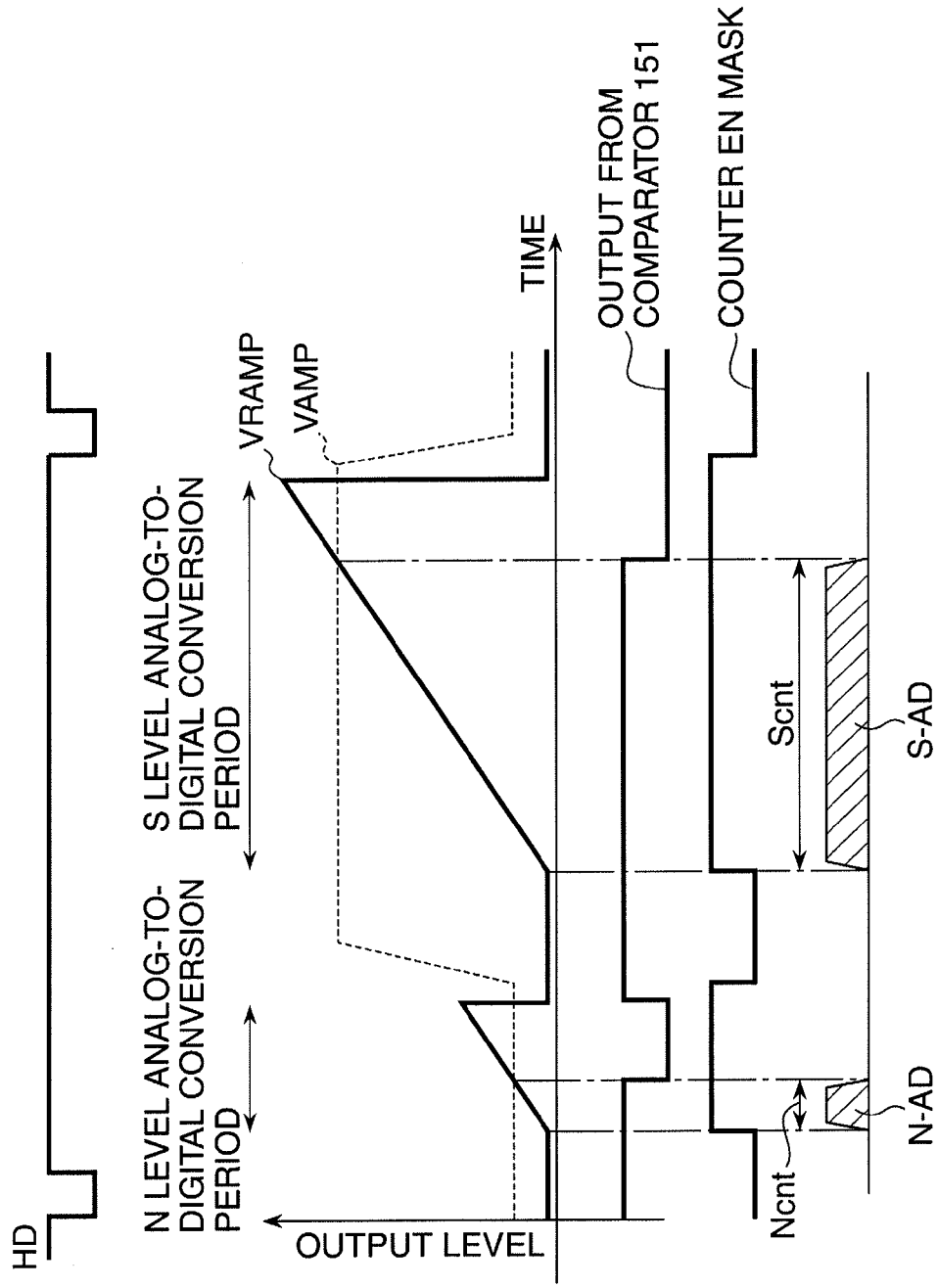
FIG. 4 is a timing diagram useful in explaining the operation of an ADC of a column ADC section appearing in FIG. 1.

FIG. 4 is a timing diagram useful in explaining the operation of an ADC of the column ADC section appearing in FIG. 1.

In an ADC of the column ADC section 150, the comparator 151 compares a ramp signal voltage (hereinafter simply referred to as the ramp voltage: VRAMP) generated by the ramp circuit 140 and an output voltage (VAMP) from each unit amplification element of the column amplifier section 130. Then, the associated counter latch circuit 152 counts time until the output from the associated comparator 151 is inverted, and latches the count value. The counter latch circuit 152 includes a plurality of latch circuits, and is capable of accumulating a plurality of AD data items (analog-to-digital conversion results).

The comparator 151 outputs an H-level signal as the comparison result signal, when the VRAMP is lower in level than the VAMP. On the other hand, the comparator 151 outputs an L-level signal as the comparison result signal when the VRAMP is not lower in level than the VAMP.

During a time period in which a counter EN (enable) mask signal is at an H level, when the counter latch circuit 152 is caused to perform the counting operation (up-counting operation) until the output from the comparator 151 is inverted, the level of the VAMP is converted to a count value (digital value), i.e. the analog-to-digital conversion is performed.

Although the above description is given of the operation performed for the analog-to-digital conversion of the S-level voltage signal, the same operation is similarly performed for the analog-to-digital conversion of an N-level voltage signal. Thus, the N-level voltage signal is counted during an Ncnt time period whereby the N-AD is obtained, and the S-level voltage signal is counted during an Scnt time period whereby the S-AD is obtained.

In this operation, a conversion gain (analog-to-digital conversion gain) between voltage and digital code is controlled by a slope of the VRAMP. More specifically, as the slope of the VRAMP is larger, sensitivity per LSB of the count value (digital value) to a change in output of the VAMP is lower. On the other hand, as the slope of the VRAMP is smaller, sensitivity per LSB of the digital value to a change in output of the VAMP is higher. By making use of this characteristic, it is possible to perform gain-based calculation.

In the illustrated column ADC section 150, the number of bits of the analog-to-digital conversion output varies with the frequency of operation clock signal (CLK frequency) at which the counter is operated. That is, as the CLK frequency becomes higher, a value which can be counted by the counter latch circuit 152 during the H-level period increases, and hence the number of bits in the analog-to-digital conversion output varies with the CLK frequency. Therefore, by stepwise increasing or decreasing the operation clock frequency (CLK frequency) supplied to the counter latch circuit 152, i.e. the operation frequency of the counter latch circuit 152, it is possible to stepwise increase or decrease the number of bits of the analog-to-digital conversion output.

This makes it possible, when the solid-state image pickup apparatus 10 is required to have a bit accuracy in output, increase the number of bits by increasing the operation frequency of each counter latch circuit 152, whereas when the solid-state image pickup apparatus 10 is not required to have a bit accuracy in output, to reduce power consumption by reducing the operation frequency of the same.

For example, assuming that the solid-state image pickup apparatus 10 is mounted on a camera or video camera, in a case where an object is shot and recorded by the camera or video camera, the operation frequency of each counter latch circuit 152 is increased to thereby improve the bit accuracy.

On the other hand, in a case where an object is not shot and recorded, the user only views an image which is an output from the solid-state image pickup apparatus 10 using a user interface, such as a display panel, and hence, judging that there is no problem in viewing even if the number of bits of the analog-to-digital conversion output is small, the operation frequency of each counter latch circuit 152 is reduced to thereby reduce the bit accuracy.

Through execution of the above-described sequential operations, the N-AD is obtained by performing analog-to-digital conversion of the N-level signal from each pixel, and the S-AD is obtained by performing analog-to-digital conversion of the S-level signal from the pixel.

The counter latch circuit 152 stores the N-AD and S-AD, and the horizontal transfer circuit 160 sequentially reads out the results of analog-to-digital conversion (N-AD and S-AD) latched by the plurality of ADCs of the column ADC section 150, and sends the read results to the signal processing circuit 170.

The signal processing circuit 170 subtracts (N-AD) from (S-AD) on a pixel-by-pixel basis to thereby perform so-called CDS (correlated double sampling). Further, the signal processing circuit 170 superimposes a predetermined offset amount so as to adjust the black level of image data, and performs multiplication for gain adjustment. Then, the signal processing circuit 170 outputs a processed signal to the external output circuit 180.

Although in the above-described example, the S-AD and N-AD are separately latched, and then read out to be subjected to CDS, if the counter latch circuit 152 is provided with an up-down counter, it is possible to perform CDS by the counter operation.

As described above, in the solid-state image pickup apparatus 10, the blocks 300 and 301 are symmetrically arranged with the pixel section 110 in the center. Hereafter, the block 300 is referred to as the upper AD 300, and the block 301 is referred to as the lower AD 301.

By the way, in the pixel section 110 appearing in FIG. 1, the PDs 112 provided in the respective pixels 111 are different in sensitivity. More specifically, for the PDs 112, there are used two types of photodiodes: low-sensitivity (first sensitivity) photodiodes and high-sensitivity (second sensitivity) photodiodes. The pixel section 110 is formed by low sensitivity pixels (first pixel) 111 having the low-sensitivity (first sensitivity) photodiodes and the high sensitivity pixels (second pixel) 111 having the high-sensitivity (second sensitivity) photodiodes. In other words, as recited in claims appended hereto, it can be regarded that a plurality of pixels arranged in the pixel section 110 in a two-dimensional matrix form each has a first pixel having a first sensitivity to an amount of entered light, and a second pixel having a second sensitivity which is higher than the first sensitivity. As a result, as described hereinafter, it is possible to generate a wide dynamic range image using low-sensitivity image data and high-sensitivity image data.

In the illustrated example in FIG. 1, pixel signals output from the low-sensitivity pixels are processed by the upper AD 300, and pixel signals output from the high-sensitivity pixels are processed by the lower AD 301. Then, in the upper AD 300 and the lower AD 301, the column amplifier circuits 130 and 230 have different gains from each other, and the ramp circuits 140 and 240 output ramp signals which are different in slope from each other.

As a result, it is possible to set the analog-to-digital conversion gains which are different from each other between image data generated by the low-sensitivity pixels and image data generated by the high-sensitivity pixels.

In addition, by causing the counter latch circuits 152 and 252 in the upper AD 300 and the lower AD 301 to perform the counting operation at different operation frequencies from each other, it is possible to differentiate the bit accuracy between image data generated by the low-sensitivity pixels and image data generated by the high-sensitivity pixels.

In the above-described embodiment, the pixel section 110 includes pixels which are different in sensitivity to light, and hence it is possible to perform two types of analog-to-digital conversion in parallel using the different analog-to-digital converters for the respective pixels which are different in sensitivity. As a result, it is possible to cope with a high-frame rate imaging, and what is more, it is possible to simultaneously obtain high-sensitivity image data and low-sensitivity image data necessary for generating a wide dynamic range image data.

Further, it is possible not only to separately amplify a high-sensitivity image signal and a low-sensitivity image signal using different gains, but also to set a slope of a ramp signal (AD gain) independently for each of the signals. In addition, as mentioned above, it is possible to set the operation frequencies of the counter latch circuits 152 and 252 independently of each other, and hence it is possible to differentiate the bit accuracy between the high-sensitivity image data and low-sensitivity image data.

Further, in a case where it is not necessary to increase the dynamic range for shooting, it is only necessary to generate image data by the upper AD 300 or the lower AD 301, and by stopping the operation of the upper AD 300 or the lower AD 301, which is not in use, it is possible to reduce power consumption. Further, it is possible to change the control of the solid-state image pickup apparatus 10 according to the operation mode of the camera.

FIG. 5 is a diagram useful in explaining the control performed according to the operation mode of the camera on which the solid-state image pickup apparatus 10 shown in FIG. 1 is mounted.

When the camera is powered off, the upper AD 300 and the lower AD 301 are both powered off.

Now, when a moving image or a still image is taken by the camera, time during which image data is not recorded in a hard disk or a nonvolatile memory provided in the camera, i.e. time during which panning or zooming is performed without recording image data in order to determine an angle of view for shooting, or time during which an aperture of a lens is adjusted so as to adjust exposure, is referred to as non-recording time.

During non-recording time, the user views an image via a display section, such as a liquid crystal panel, provided for the camera. At this time, the display section provided for the camera is lower in resolution than image data to be recorded, and it is difficult for the user to recognize e.g. deterioration of the S/N ratio of the image displayed on the display section.

Therefore, during non-recording time (non-recording operation state), for example, the upper AD 300 is controlled to be powered on, and the lower AD 301 is controlled to be powered off. Then, an image formed based on an output (image data) from the upper AD 300 is displayed on the display section.

After confirming the image displayed on the display section, the user shoots and records the image. In the imaging-recording operation (simply referred to as the recording operation), to perform image shooting with a wide dynamic range (predetermined dynamic range), the lower AD 301 is also controlled to be powered on. That is, the upper AD 300 and the lower AD 301 are both controlled to be powered on. This makes it possible to perform wide dynamic range image shooting, and high-frame rate imaging in the case of moving image shooting.

In the recording operation, to perform image shooting with a non-wide dynamic range (dynamic range other than the predetermined dynamic range), only the upper AD 300 is controlled to be powered on, but the lower AD 301 is controlled to be powered off.

Figure 6A:
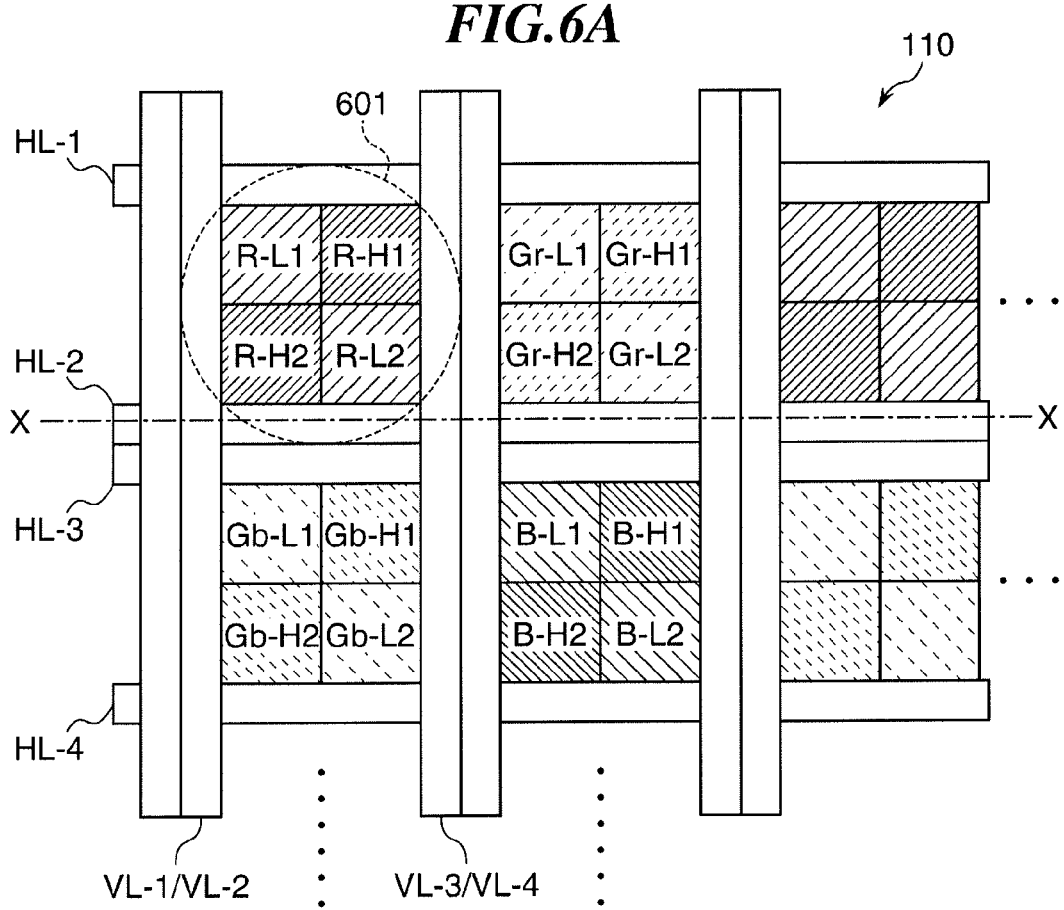
Figure 6B:
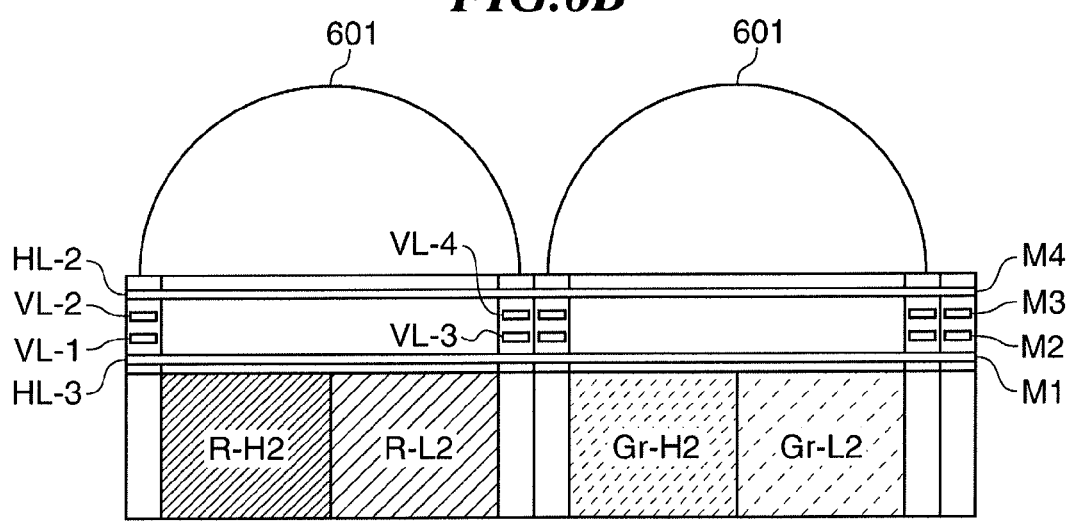

FIGS. 6A and 6B are diagrams useful in explaining an example of a pixel structure of the pixel section 110 appearing in FIG. 1, in which FIG. 6A is a plan view, and FIG. 6B is a cross-sectional view taken along X-X in FIG. 6A.

FIG. 6A shows a two-dimensional image of a light receiving surface of the pixel section 110, and the pixel structure is a repeated structure of a primary color Bayer array of R (red), G (green), and B (blue). Although the primary color Bayer array is described by ways of example, a complementary color Bayer array may be employed.

In FIG. 6A, color filters of the same color are used for four pixels of R-L1, R-L2, R-H1, and R-H2. These pixels R-L1, R-L2, R-H1, and R-H2 have high sensitivity to R (red). The pixels R-L1, R-L2, R-H1, and R-H2 share one micro lens 601. Further, the pixels R-L1, R-L2, R-H1, and R-H2 are point-symmetrically arranged.

Note that it is assumed in this example that the pixels R-H1 and R-H2 have relatively higher sensitivity than the pixels R-L1 and R-L2. Color filters of the same color are used and one micro lens is shared between pixels, similarly, as for the pixels B-L1, B-L2, B-H1, and B-H2, the pixels Gr-L1, Gr-L2, Gr-H1, and Gr-H2, and the pixels Gb-L1, Gb-L2, Gb-H1, and Gb-H2.

To make the pixels different in sensitivity, the aperture ratios of photodiodes provided for the respective pixels are made different. Alternatively, the areas of the photodiodes may be made different, or the impurity densities of substrates of the photodiodes may made different. Further alternatively, the optical characteristics of the photodiodes may be made different by respective color filters affixed to the photodiodes.

The vertical read-out lines VL-1, VL-2, VL-3, and VL-4 extending in the vertical direction are interconnections for reading out voltage signals generated by photoelectrical conversion in the pixel section 110, and each correspond to the vertical read-out line 117 appearing in FIG. 2. The lines HL-1, HL-2, HL-3, and HL-4 extending in the horizontal direction are interconnections through which pixel selection signals controlled by the timing controller 100, appearing in FIG. 1 are supplied.

As shown in FIG. 6B, the pixel section 110 has an interconnection layer having a four-layer structure, and assuming that the four-layer interconnections are denoted by M1, M2, M3, and M4 starting with one closest to the photodiode, the interconnections M1 and M4 correspond to the interconnections HL-1 (and Hl-3 appearing in FIG. 6A) and HL-2 (and Hl-4 appearing in FIG. 6A) extending in the horizontal direction, respectively, and the interconnections M2 and M3 correspond to the vertical read-out lines VL-1, VL-2, VL-3, and VL-4.

As the number of layers of the interconnection layer is increased, the degree of freedom in wiring the various interconnections, such as vertical read-out lines, becomes higher, but if the number of layers of the interconnection layer is increased, the distance from the photodiode to the micro lens 601 is increased. This reduces the amount of light received by the photodiode, and accordingly reduces the sensitivity, and hence it is desirable to reduce the number of layers of the interconnection layer.

In this example, it is assumed that out of the pixels shown in FIG. 6A, the low-sensitivity pixels R-L1, R-L2, B-L1, and Gb-L2 use only the interconnection M2 as the vertical read-out line, and the high-sensitivity pixels R-H1, R-H2, B-H1, and Gb-H2 use only the interconnection M3 as the vertical read-out line.

As described above, when reading out voltage signals from the pixel section 110, voltage signals from the low-sensitivity pixels are read out through the interconnection M2, and voltage signals from the high-sensitivity pixels are read out through the interconnection M3, whereby it is possible to make the read-out characteristics uniform between the low-sensitivity images and between the high-sensitivity images, respectively.

The interconnections M2 and M3 are different from each other not only in e.g. floating capacitance generated between the same and the neighboring interconnections, but also in resistance per unit length thereof, depending on the different physical position in the pixel section 110. This difference affects a transient response when a voltage signal is read out through the vertical read-out line. As a result, even when the same amount of charge is accumulated in the photodiode of each pixel, the outputs of the analog-to-digital conversion are sometimes different due to different transient response characteristics.

For this reason, by reading out voltage signals from the low-sensitivity pixels through the interconnection M2, and voltage signals from the high-sensitivity pixels through the interconnection M3, it is possible to reduce the difference in characteristics due to the difference in interconnection layers used for reading out the voltage signals.

Further, the interconnections M2 and M3 are sometimes different in influence of crosstalk from the neighboring circuits depending on the different physical position. As described above, by unifying the interconnection layers used for reading out voltage signals from the low-sensitivity pixels, and the interconnection layers used for reading out voltage signals from the high-sensitivity pixels, respectively, it is possible to equalize the influence of crosstalk from the neighboring circuits.

Although it is easy to remove the equalized influence of crosstalk (e.g. offset uniformly superimposed over a screen) by signal processing executed in a latter processing stage, it is difficult to remove non-uniformity generated between the pixels in one image by the signal processing executed in the latter processing stage.

Figure 7:
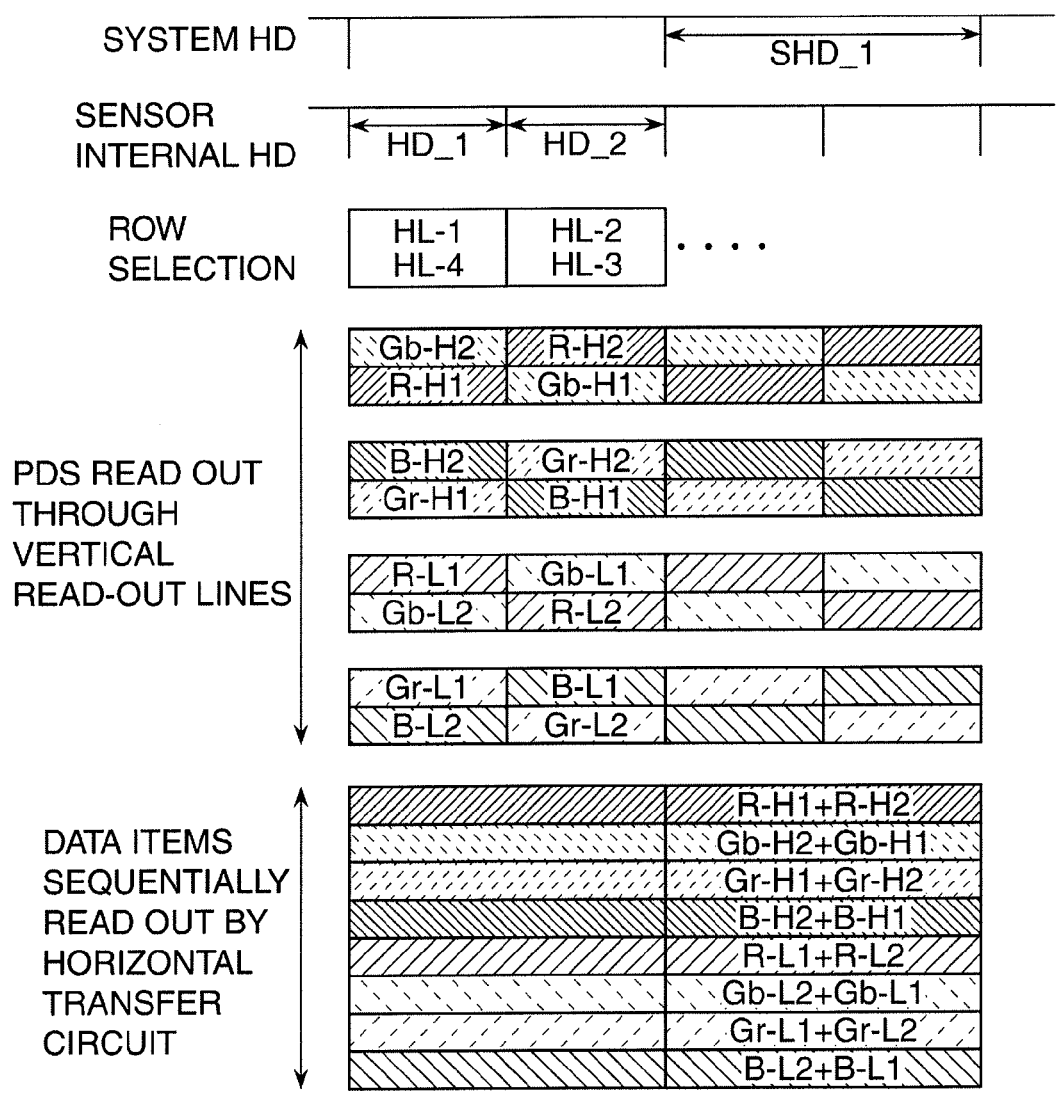
FIG. 7 is a diagram useful in explaining an example of read-out timing at which pixels are read out from the pixel section shown in FIGS. 6A and 6B.

FIG. 7 is a diagram useful in explaining an example of read-out timing at which pixels are read out from the pixel section 110 shown in FIGS. 6A and 6B.

In the read-out control performed by the solid-state image pickup apparatus, in general, for one frame of an image, voltage signals are sequentially read out on a row-by-row basis from an upper row to a lower row, as viewed in FIG. 7, in the pixel section, i.e. from a leading row in a sub scanning direction to a trailing row in the sub scanning direction. Hereafter, read-out timing on a row-by-row basis is referred to as the HD timing.

In reading out pixels on a row-by-row basis, voltage signals are read out from the FDs of pixels of the pixel section 110 at a sensor internal HD timing. Further, the horizontal transfer circuit 160 appearing in FIG. 1 performs processing on a row-by-row basis at a system HD timing. In the illustrated example, the respective repetition periods of the system HD timing and the sensor internal HD timing have a relationship of 1:2.

During a time period HD_1 (first time period), voltage signals are read out from the FDs of pixels selected through the interconnections HL-1 and HL-4. That is, the voltage signals (i.e. FD signals) from the pixels R-L1, Gb-L2, Gb-H2, and R-H1 are read out through the interconnections VL-1, VL-3, VL-2, and VL-4, respectively.

Next, during a time period HD_2 (second time period), voltage signals are read out from the FDs of pixels selected through the interconnections HL-2 and HL-3. That is, the voltage signals from the pixels Gb-L1, R-L2, R-H2, and Gb-H1 are read out through the interconnections VL-1, VL-3, VL-2, and VL-4, respectively.

Note that the pixels of Gr and B have the same relationship concerning the read-out of pixels therebetween as that between the pixels of R and Gb.

FIGS. 8A and 8B are diagrams useful in explaining flows of signals in the read-out control described with reference to FIG. 7, in which FIG. 8A shows flows of signals during the first time period, and FIG. 8B shows flows of signals during the second time period.

As described hereinabove, the counter latch circuit 152 includes a plurality of latch circuits, and is capable of accumulating a plurality of AD data items (analog-to-digital conversion results). Further, during the time period HD_1, the pixel signals are read out from the pixels R-L1, Gb-L2, Gb-H2, and R-H1, as described hereinabove, and each ADC of the column ADC section 150, which corresponds to an associated one of interconnections (vertical read-out lines), performs analog-to-digital conversion of each pixel signal to give a pixel data item. The pixel data item as a result of the analog-to-digital conversion is held in one of a plurality of latches of the counter latch circuit 152 associated with each interconnection (vertical read-out line). Further, as described hereinabove, during the time period HD_2, pixel signals are read out from the pixels Gb-L1, R-L2, R-H2, and Gb-H1 as described hereinabove, and a pixel data item as a result of analog-to-digital conversion of each of these pixel signals is held in another of the latches of the counter latch circuit 152.

Then, during a time period SHD_1 (third time period) in FIG. 7, the plurality of (two, in the present embodiment) digital data items (pixel data items) held in each counter latch circuit 152 are read out. That is, the digital data items which are pixel data items based on the pixel signals read from the pixels R-L1, Gb-L2, Gb-H2, R-H1, Gb-L1, R-L2, R-H2, and Gb-H1 are read out from the associated latches.

Reading of pixel data items from the counter latch circuits 152 of the ADCs of the column ADC section 150 is controlled by the horizontal transfer circuit 160. For example, the pixel data items are selectively read out from the column ADC section, on a plurality of columns-by-a plurality of columns basis, sequentially in a left to right manner, i.e. from a plurality of counter latch circuits 152 including the counter latch circuit 152 at the leftmost end to a plurality of counter latch circuits 152 including the counter latch circuit 152 at the rightmost end, and are passed to the to the signal processing circuit 170. The plurality of columns mentioned here are e.g. eight columns or sixteen columns.

Note that one counter latch circuit 152 has a plurality of latches as mentioned hereinabove, and pixel data items held in the latches may be read out by physically providing a plurality of interconnections connected thereto, respectively, or may be read out in a time division manner by sharing one interconnection between the plurality of latches. In this case, it is required to cause interconnections not used for reading to be placed in a high-z output state or be subjected to a similar countermeasure.

The pixel data items associated the pixels R-L1 and R-L2 read from the associated counter latch circuits 152 are digitally added by the signal processing circuit 170 to be output as a pixel data item (R-L1+R-L2). Further, the pixel data items associated the pixels Gb-L1 and Gb-L2 are also similarly digitally added to be output as a pixel data item (Gb-L1+Gb-L2). The pixel data items associated with the other pixels are also processed similarly.

Here, although in the above description, e.g. the pixels R-L1 and R-L2 are digitally added, this is not limitative, but they may be subjected to gain-based calculation and then be added, by digital processing, to be output as a pixel data item [A*(R-L1)+B*(R-L2)] wherein A and B represents respective gains.

As described above, by controlling the sequence of operations for read-out from the pixels, it is possible to read out voltage signals from the low-sensitivity pixels through the interconnection M2, and voltage signals from the high-sensitivity pixels through the interconnection M3.

Figure 9:
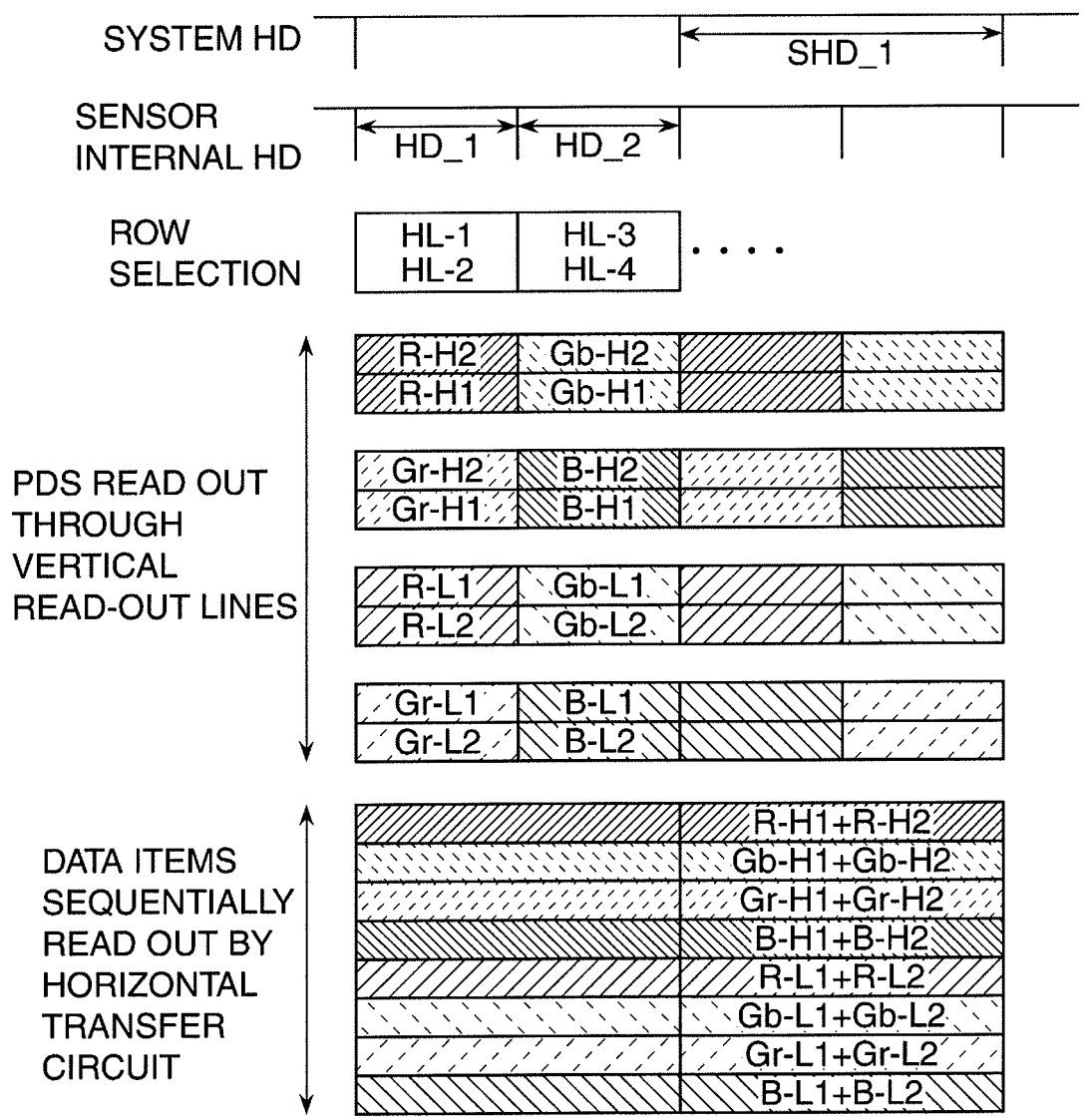
FIG. 9 is a diagram useful in explaining another example of the read-out timing at which pixels are read out from the pixel section shown in FIGS. 6A and 6B.

FIG. 9 is a diagram useful in explaining another example of the read-out timing at which pixels are read out from the pixel section 110 shown in FIGS. 6A and 6B. In FIG. 9, component elements identical to those shown in FIG. 7 are denoted by the identical reference numerals.

Similarly to FIG. 7, in reading out pixels on a row-by-row basis, voltage signals are read out from the FDs of pixels of the pixel section 110 at the sensor internal HD timing. Further, the horizontal transfer circuit 160 appearing in FIG. 1 performs processing on a row-by-row basis at the system HD timing.

During a time period HD_1 which is the first time period, voltage signals are read from the FDs of pixels selected through the interconnections HL-1 and HL-2 appearing in FIGS. 6A and 6B. That is, the voltage signals (FD signals) from the pixels R-L1, R-L2, R-H1, and R-H2 are read out through the interconnections VL-1, VL-3, VL-2, and VL-4, respectively.

Next, during a time period HD_2 which is the second time period, voltage signals are read out from the FDs of pixels selected through the interconnections HL-3 and HL-4 appearing in FIGS. 6A and 6B. That is, the voltage signals from the pixels Gb-L1, Gb-L2, Gb-H2, and Gb-H1 are read out through the interconnections VL-1, VL-3, VL-2, and VL-4, respectively.

Figure 10A:
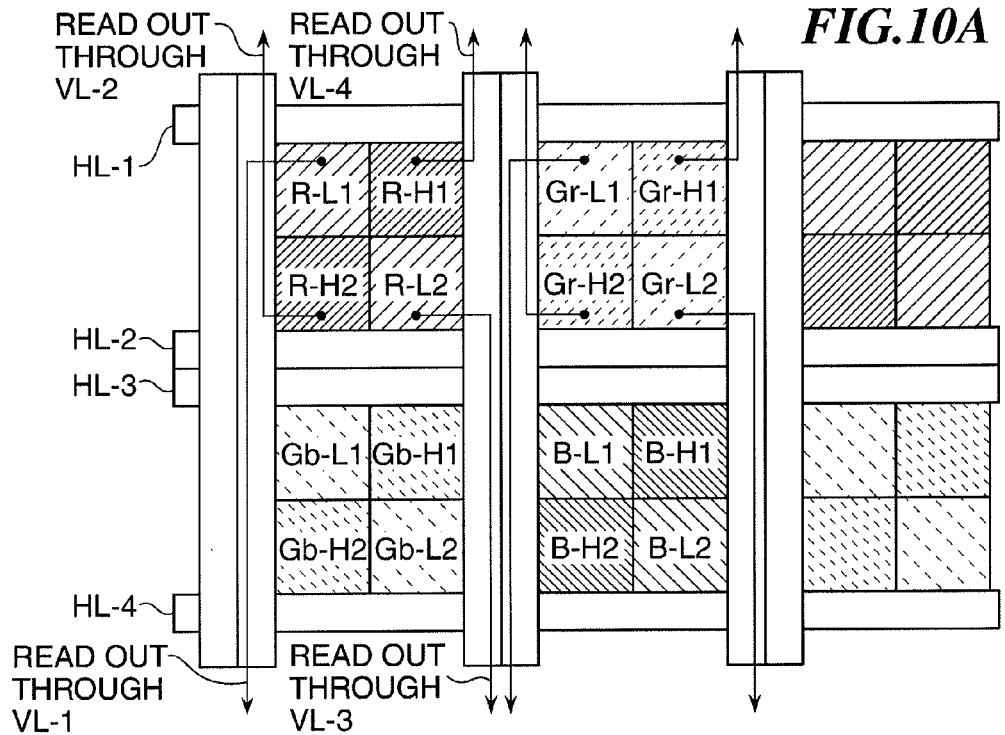
Figure 10B:
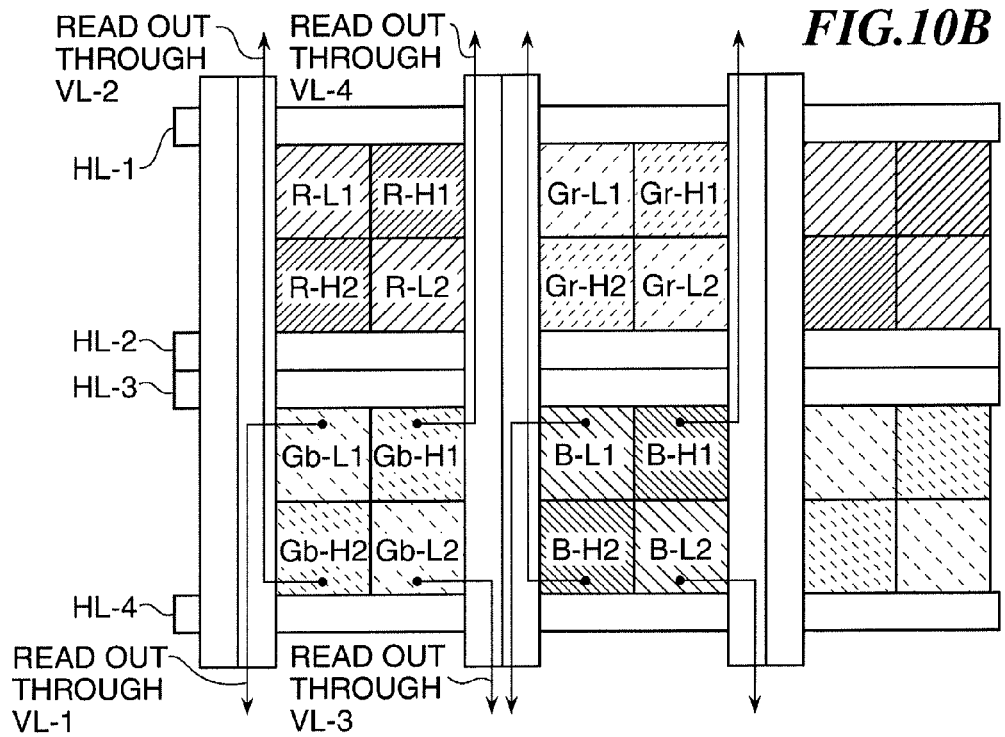

FIGS. 10A and 10B are diagrams useful in explaining flows of signals in the read-out control described with reference to FIG. 9, in which FIG. 10A shows flows of signals during the first time period, and FIG. 10B shows flows of signals during the second time period.

As described hereinabove with reference to FIG. 1, voltage signals read from pixels are subjected to analog-to-digital conversion by the counter latch circuits 152 and are held therein, respectively. Then, the digital data items (pixel data items) held in the counter latch circuit 152 are sequentially read out during a time period of SHD_1 (third time period).

By thus controlling the sequence of operations for read-out from the pixels as well, it is possible to read out voltage signals from the low-sensitivity pixels through the interconnection M2, and voltage signals from the high-sensitivity pixels through the interconnection M3.

Figure 11:
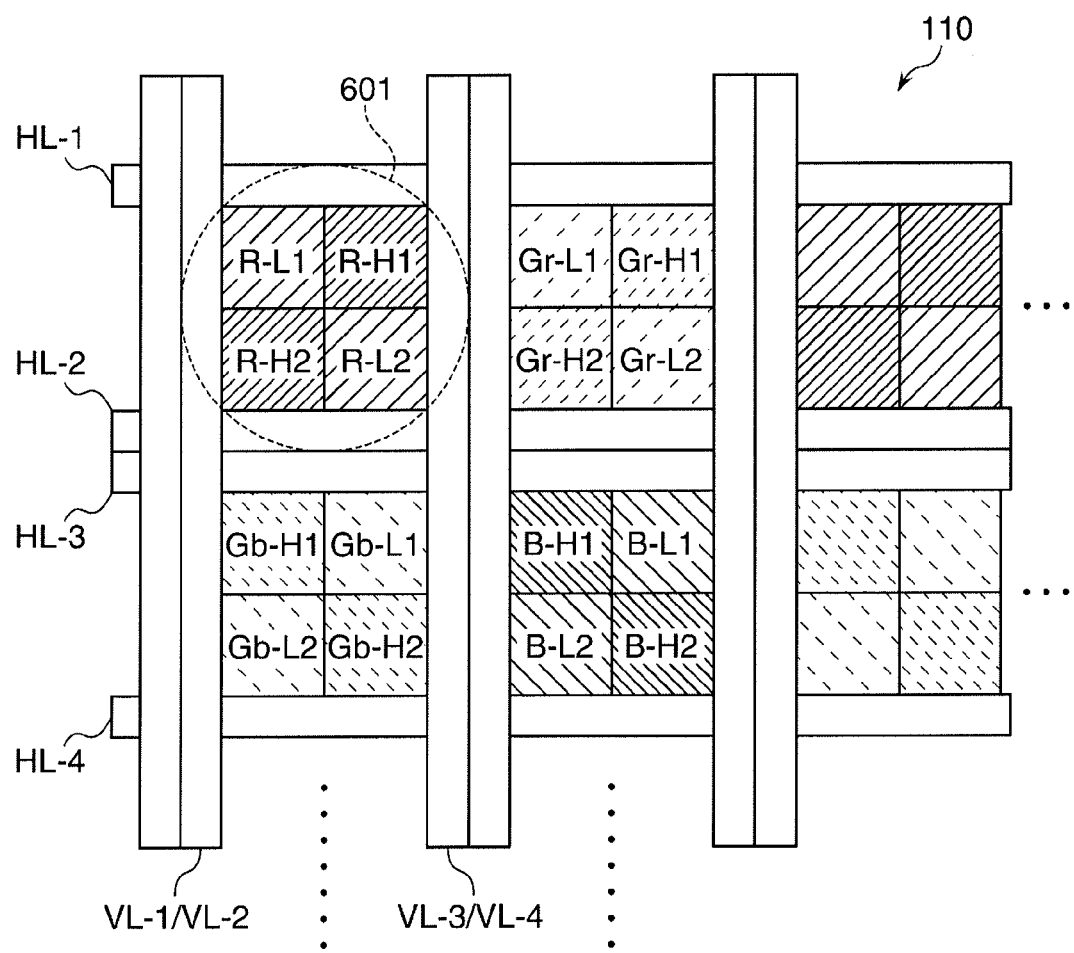
FIG. 11 is a diagram useful in explaining another example of the pixel structure of the pixel section appearing in FIG. 1.

FIG. 11 is a diagram useful in explaining another example of the pixel structure of the pixel section appearing in FIG. 1.

In FIG. 11, the same elements as appearing in FIGS. 6A and 6B are denoted by the same reference numerals, and description thereof is omitted. The pixel section 110 in FIG. 11 differs from the pixel section 110 shown in FIGS. 6A and 6B only in the array of pixels but is the same in the other respects.

Figure 12:
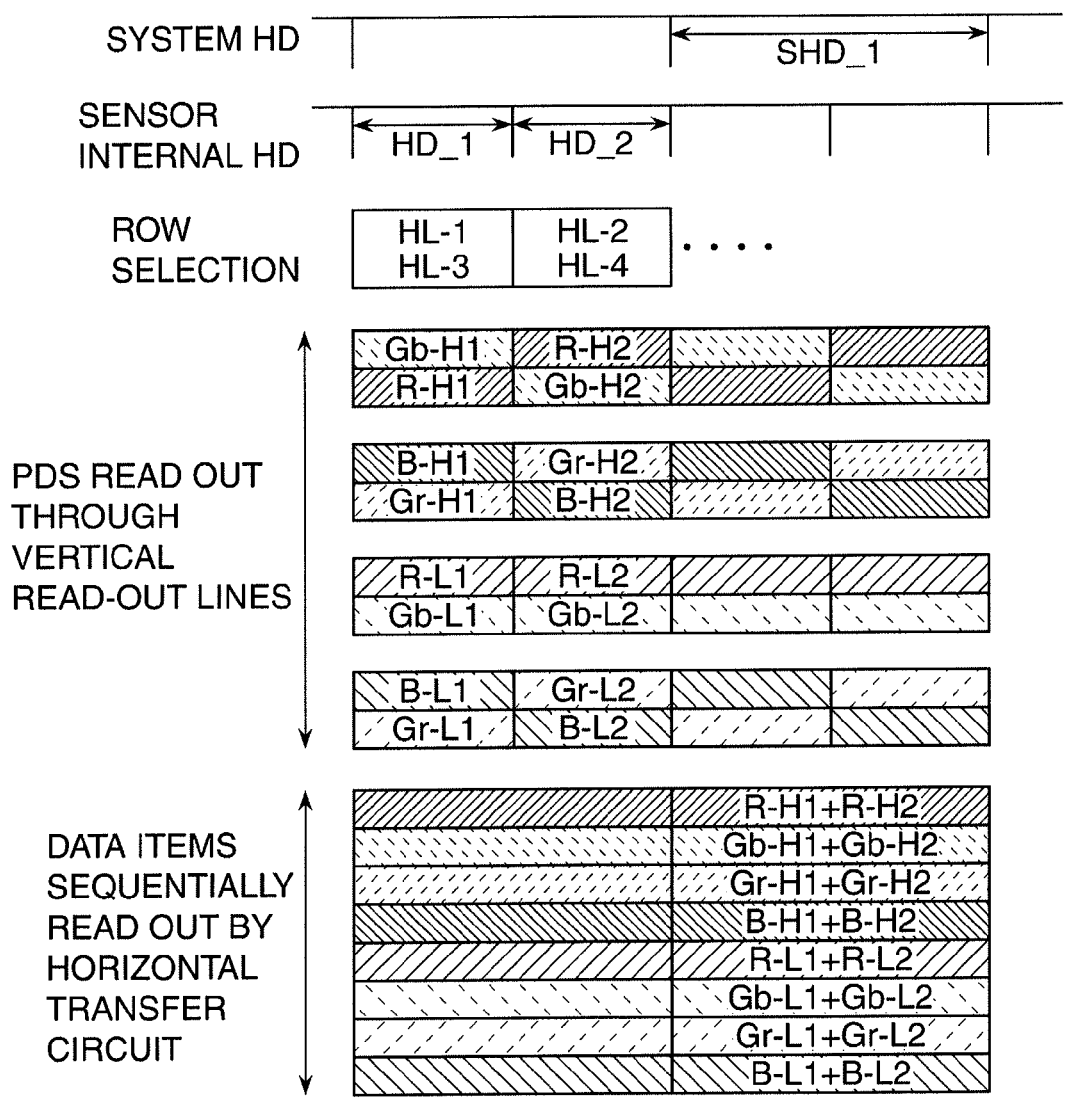
FIG. 12 is a diagram useful in explaining another example of the read-out timing at which pixels are read out from the pixel section shown in FIG. 11.

FIG. 12 is a diagram useful in explaining another example of the read-out timing at which pixels are read out from the pixel section shown in FIG. 11.

Similarly to FIG. 7, in reading out pixels on a row-by-row basis, voltage signals are read out from the FDs of pixels of the pixel section 110 at the sensor internal HD timing. Further, the horizontal transfer circuit 160 appearing in FIG. 1 performs processing on a row-by-row basis at the system HD timing.

During a time period HD_1 which is the first time period, voltage signals are read from the FDs of pixels selected through the interconnections HL-1 and HL-3 appearing in FIG. 11. That is, the voltage signals (FD signals) from the pixels R-L1, Gb-L1, Gb-H1, and R-H1 are read out through the interconnections VL-1, VL-3, VL-2, and VL-4, respectively.

Next, during a time period HD_2 which is the second time period, voltage signals are read out from the FDs of pixels selected through the interconnections HL-2 and HL-4 appearing in FIG. 11. That is, the voltage signals from the pixels Gb-L2, R-L2, R-H2, and Gb-H2 are read out through the interconnections VL-1, VL-3, VL-2, and VL-4, respectively.

Note that the pixels of Gr and B have the same relationship concerning the read-out of pixels therebetween as that between the pixels of R and Gb.

Figure 13A:
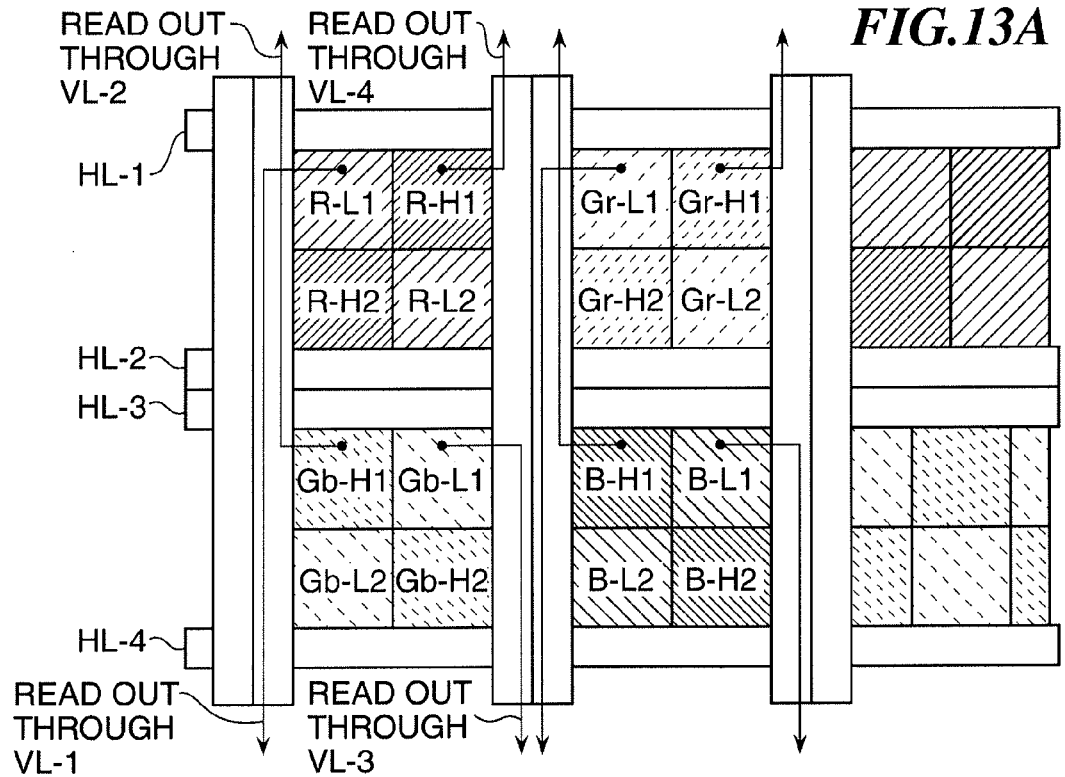
Figure 13B:
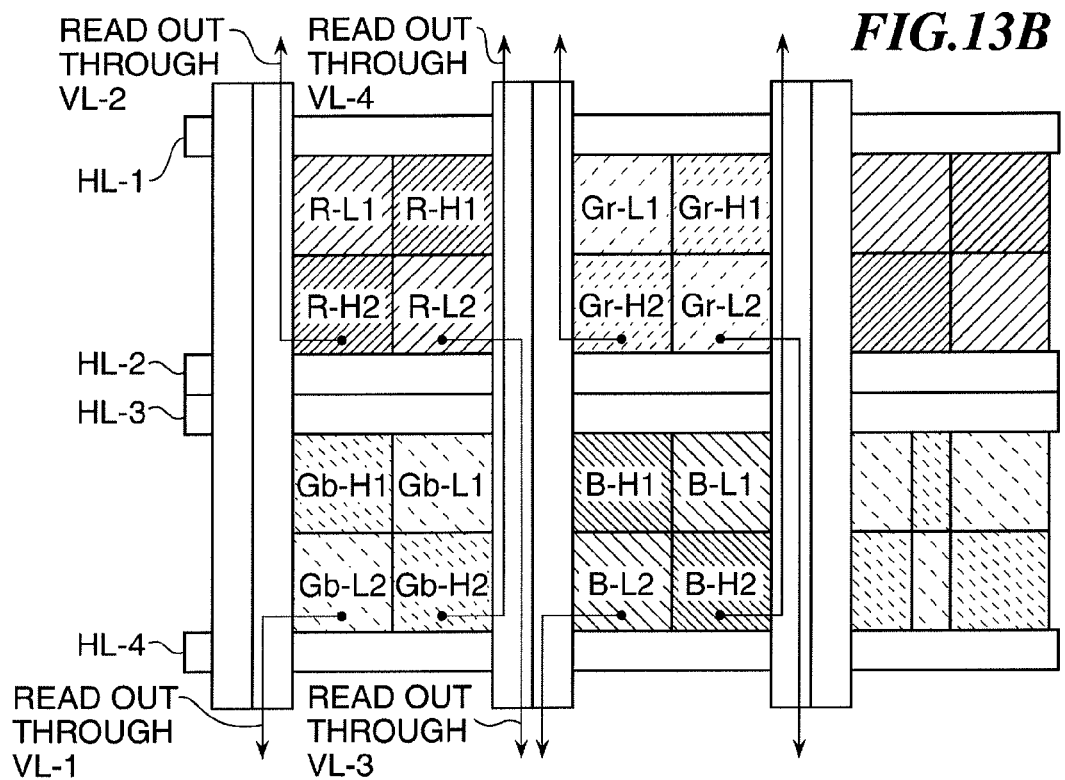

FIGS. 13A and 13B are diagrams useful in explaining flows of signals in the read-out control described with reference to FIG. 12, in which FIG. 13A shows flows of signals during the first time period, and FIG. 13B shows flows of signals during the second time period.

As described hereinabove, voltage signals read from pixels are subjected to analog-to-digital conversion by the counter latch circuits 152 and are held therein, respectively. Then, the digital data items (pixel data items) held in the counter latch circuit 152 are sequentially read out during a time period of SHD_1 (third time period).

As described above, by thus controlling the sequence of operations for read-out from the pixels, it is possible to read out voltage signals from the low-sensitivity pixels through the interconnection M2, and voltage signals from the high-sensitivity pixels through the interconnection M3.

As described above, out of the plurality of pixels arranged in a two-dimensional matrix form, only the interconnection M2 is used as the vertical read-out line for the low-sensitivity pixels R-L1, R-L2, B-L1, . . . , and Gb-L2, and only the interconnection M3 is used as the vertical read-out line for the high-sensitivity pixels R-H1, R-H2, B-H1, . . . , and Gb-H2. This makes it possible to reduce variation in pixels in one image, caused by read-out of the low-sensitivity pixels and the high-sensitivity pixels.

As described above, according to the embodiment of the present invention, it is possible to expand the dynamic range, and at the same time perform high-frame rate imaging.

As is clear from the above description, in the example shown in FIG. 1, the column amplifier section 230, the ramp circuit 240, the column ADC section 250, the horizontal transfer circuit 260, the signal processing circuit 270, and the external output circuit 280 function as a first signal processing unit. Further, the column amplifier section 130, the ramp circuit 140, the column ADC section 150, the horizontal transfer circuit 160, the signal processing circuit 170, and the external output circuit 180 function as a second signal processing unit. Further, the timing controller 100 and the vertical scanning circuit 120 function as a read-out unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, a control method based on the functions of the above-described embodiment may be caused to be executed by the solid-state image pickup apparatus. Further, a control program implement the functions of the above-described embodiment may be caused to be executed by a computer provided in the solid-state image pickup apparatus. The control program is stored e.g. in a computer-readable storage medium.

At this time, the control method and the control program each include at least a first read-out step and a second read-out step.

Aspects of the present invention can also be realized by a computer of a system or apparatus (or devices such as a CPU or MPU) that reads out and executes a program recorded on a memory device to perform the functions of the above-described embodiment, and by a method, the steps of which are performed by a computer of a system or apparatus by, for example, reading out and executing a program recorded on a memory device to perform the functions of the above-described embodiment. For this purpose, the program is provided to the computer for example via a network or from a recording medium of various types serving as the memory device (e.g., computer-readable medium).

This application claims the benefit of Japanese Patent Application No. 2012-159603, filed Jul. 18, 2012, which is hereby incorporated by reference herein in its entirety.

What is claimed is:

1. An image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, the image pickup apparatus comprising:
a first signal processing unit and a second signal processing unit each configured to perform analog-to-digital conversion processing on a pixel signal read from each pixel of the pixel section to thereby obtain image data;
an interconnection layer including a plurality of interconnections for transferring the pixel signal to said first signal processing unit and said second signal processing unit; and
a read-out unit configured to, when the pixel signal is read out from the first pixel, transfer the pixel signal to said first signal processing unit through one interconnection of said interconnection layer, and when the pixel signal is read out from the second pixel, transfer the pixel signal to said second signal processing unit through another interconnection of said interconnection layer, wherein
in a case where the image pickup apparatus is to perform shooting with a predetermined dynamic range, said first signal processing unit and said second signal processing unit are both powered on, and
in a non-recording operation state in which the image pickup apparatus is powered on but a shooting operation is not performed by the image pickup apparatus, said second signal processing unit is powered off whereas said first signal processing unit is powered on.

2. The image pickup apparatus according to claim 1, wherein respective frequencies of clock signals supplied to said first signal processing unit and said second signal processing unit for the analog-to-digital conversion processing performed thereby are controlled independently of each other.

3. The image pickup apparatus according to claim 1, wherein said first signal processing unit and said second signal processing unit are disposed on a substrate in a manner sandwiching the pixel section therebetween.

4. An image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, the image pickup apparatus comprising:
a first signal processing unit and a second signal processing unit each configured to perform analog-to-digital conversion processing on a pixel signal read from each pixel of the pixel section to thereby obtain image data;
an interconnection layer including a plurality of interconnections for transferring the pixel signal to said first signal processing unit and said second signal processing unit; and
a read-out unit configured to, when the pixel signal is read out from the first pixel, transfer the pixel signal to said first signal processing unit through one interconnection of said interconnection layer, and when the pixel signal is read out from the second pixel, transfer the pixel signal to said second signal processing unit through another interconnection of said interconnection layer, wherein
in a case where the image pickup apparatus is to perform shooting with a predetermined dynamic range, said first signal processing unit and said second signal processing unit are both powered on, and
when the image pickup apparatus is to perform shooting with a dynamic range other than the predetermined dynamic range, said second signal processing unit is powered off whereas said first signal processing unit is powered on.

5. A method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to said first signal processing unit and said second signal processing unit, the method comprising:
transferring, when the pixel signal is read out from the first pixel, the pixel signal to said first signal processing unit through one interconnection of said interconnection layer; and transferring, when the pixel signal is read out from the second pixel, the pixel signal to said second signal processing unit through another interconnection of said interconnection layer, and wherein in a case where the image pickup apparatus is to perform shooting with a predetermined dynamic range, said first signal processing unit and said second signal processing unit are both powered on, and in a non-recording operation state in which the image pickup apparatus is powered on but a shooting operation is not performed by the image pickup apparatus, said second signal processing unit is powered off whereas said first signal processing unit is powered on.

6. A non-transitory computer-readable storage medium storing a computer-executable control program for causing a computer to execute a method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to said first signal processing unit and said second signal processing unit, wherein the method comprises:

transferring, when the pixel signal is read out from the first pixel, the pixel signal to said first signal processing unit through one interconnection of said interconnection layer; and transferring, when the pixel signal is read out from the second pixel, the pixel signal to said second signal processing unit through another interconnection of said interconnection layer, and wherein in a case where the image pickup apparatus is to perform shooting with a predetermined dynamic range, said first signal processing unit and said second signal processing unit are both powered on, and in a non-recording operation state in which the image pickup apparatus is powered on but a shooting operation is not performed by the image pickup apparatus, said second signal processing unit is powered off whereas said first signal processing unit is powered on.

7. A method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to said first signal processing unit and said second signal processing unit, the method comprising:

transferring, when the pixel signal is read out from the first pixel, the pixel signal to said first signal processing unit through one interconnection of said interconnection layer; and transferring, when the pixel signal is read out from the second pixel, the pixel signal to said second signal processing unit through another interconnection of said interconnection layer, and wherein in a case where the image pickup apparatus is to perform shooting with a predetermined dynamic range, said first signal processing unit and said second signal processing unit are both powered on, and when the image pickup apparatus is to perform shooting with a dynamic range other than the predetermined dynamic range, said second signal processing unit is powered off whereas said first signal processing unit is powered on.

8. A non-transitory computer-readable storage medium storing a computer-executable control program for causing a computer to execute a method of controlling an image pickup apparatus including a pixel section formed by arranging a plurality of pixels in a two-dimensional matrix form, each pixel including a first pixel having a first sensitivity to an amount of entered light, and a second pixel having a second sensitivity which is higher than the first sensitivity, a first signal processing unit and a second signal processing unit each configured to perform analog-to-digital conversion processing on a pixel signal read from each pixel of the pixel section to thereby obtain image data, and an interconnection layer including a plurality of interconnections for transferring the pixel signal to said first signal processing unit and said second signal processing unit, wherein the method comprises:

transferring, when the pixel signal is read out from the first pixel, the pixel signal to said first signal processing unit through one interconnection of said interconnection layer; and transferring, when the pixel signal is read out from the second pixel, the pixel signal to said second signal processing unit through another interconnection of said interconnection layer, and wherein in a case where the image pickup apparatus is to perform shooting with a predetermined dynamic range, said first signal processing unit and said second signal processing unit are both powered on, and when the image pickup apparatus is to perform shooting with a dynamic range other than the predetermined dynamic range, said second signal processing unit is powered off whereas said first signal processing unit is powered on.

* * * * *